United States Patent
Qian et al.

(10) Patent No.: US 10,297,627 B1
(45) Date of Patent: May 21, 2019

(54) CHIP SCALE PACKAGE FOR AN IMAGE SENSOR

(71) Applicant: OmniVision Technologies, Inc., Santa Clara, CA (US)

(72) Inventors: Yin Qian, Milpitas, CA (US); Chen-Wei Lu, San Jose, CA (US); Jin Li, San Jose, CA (US); Chia-Chun Miao, Sunnyvale, CA (US); Ming Zhang, Fremont, CA (US); Dyson Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/806,522

(22) Filed: Nov. 8, 2017

(51) Int. Cl.
*H01L 27/146* (2006.01)

(52) U.S. Cl.
CPC .... *H01L 27/14618* (2013.01); *H01L 27/1462* (2013.01); *H01L 27/14627* (2013.01); *H01L 27/14685* (2013.01)

(58) Field of Classification Search
CPC ......... H01L 27/14618; H01L 27/14685; H01L 27/1462
See application file for complete search history.

(56) References Cited

U.S. PATENT DOCUMENTS

| | | | | |
|---|---|---|---|---|
| 5,239,412 A | * | 8/1993 | Naka et al. | 359/619 |
| 7,173,231 B2 | | 2/2007 | Chen | |
| 2003/0197210 A1 | * | 10/2003 | Uchida | 257/294 |
| 2016/0355709 A1 | * | 12/2016 | Katou et al. | C09J 133/14 |
| | | | | 257/434 |

* cited by examiner

*Primary Examiner* — Selim U Ahmed
*Assistant Examiner* — Evan G Clinton

(57) ABSTRACT

A chip scale package (CSP) structure for an image sensor comprises an image sensor chip, wherein the image sensor chip comprises a semiconductor substrate having a top surface to receive light, a plurality of color filters disposed over the top surface, and a plurality of micro lenses disposed on the plurality of color filters. A low refractive index material is disposed over the image sensor chip, wherein the low refractive index material covers the plurality of micro lenses, and wherein a refractive index of the low refractive index material is lower than a refractive index of the plurality of micro lenses. A cover glass is disposed directly on the low refractive index material, wherein no air gap is between the cover glass and the low refractive index material, and between the low refractive index material and the image sensor chip. Therefore, the cover glass is fully supported by the low refractive index material without any dams.

14 Claims, 2 Drawing Sheets

CHIP SCALE PACKAGE FOR AN IMAGE SENSOR

TECHNICAL FIELD

This disclosure relates generally to a chip scale package structure, and more particularly to an improved chip scale package structure for an image sensor.

BACKGROUND INFORMATION

An image sensor uses opto-electronic components, such as photodiodes, to detect incoming light and produce electronic signals in response. A primary component of the image sensor is its sensor pixel array, wherein each pixel includes a photodiode to convert photons to charge carriers, a floating node to temporarily store the charge carries, and a number of transistor gates (transfer gate, source follower, reset transistor, etc.) to convey the charge carriers out of the pixel to be further processed by a peripheral circuitry. An image sensor is often packaged with its supporting elements into an image sensor package, which is then incorporated into an imaging product such as a mobile phone camera, a consumer electronic camera, a surveillance video camera, an automotive driver assistance device, a medical imaging endoscope, etc.

For the conventional chip scale package (CSP) of an image sensor, the cover glass is supported by dams which comprise insulation materials and adhesion materials, and are located on the periphery regions of the image sensor chip. When the image sensor continues scaled down, especially for stacking chip image sensor, there is less and less periphery area for dams to land on. Such small periphery area will limit the dam width and consequently cause CSP reliability issue.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
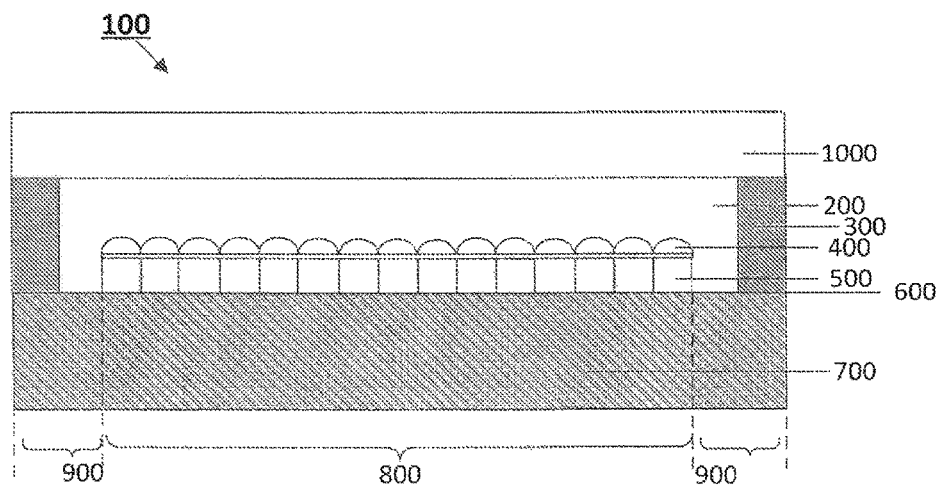
FIG. 1 is a cross sectional illustration of a conventional chip scale package (CSP) structure for an image sensor.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "example" or "embodiment" means that a particular feature, structure, or characteristic described in connection with the example is included in at least one example of the present invention. Thus, the appearances of "example" or "embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

FIG. 1 is a cross sectional illustration of a conventional chip scale package (CSP) structure 100 for an image sensor. The conventional chip scale package (CSP) structure 100 comprises an image sensor chip, wherein the image sensor chip comprises a semiconductor substrate 700 having a top surface 600 to receive light, a plurality of color filters 500 disposed over the top surface 600, and a plurality of micro lenses 400 disposed on the plurality of color filters 500. In one example, the image sensor chip comprises a light sensing array region 800 formed on the semiconductor substrate 700. The image sensor chip further comprises a peripheral circuit region 900 formed on the semiconductor substrate 700 and around the light sensing array region 800. Dams 300 are usually formed by insulation materials and adhesion materials, and situated on the top surface 600 of the semiconductor substrate 700, and in the peripheral circuit region 900. A cover glass 1000 is disposed over the image sensor chip, and supported by the dams 300. There is an air gap 200 between the cover glass 1000 and the image sensor chip.

Figure 2:
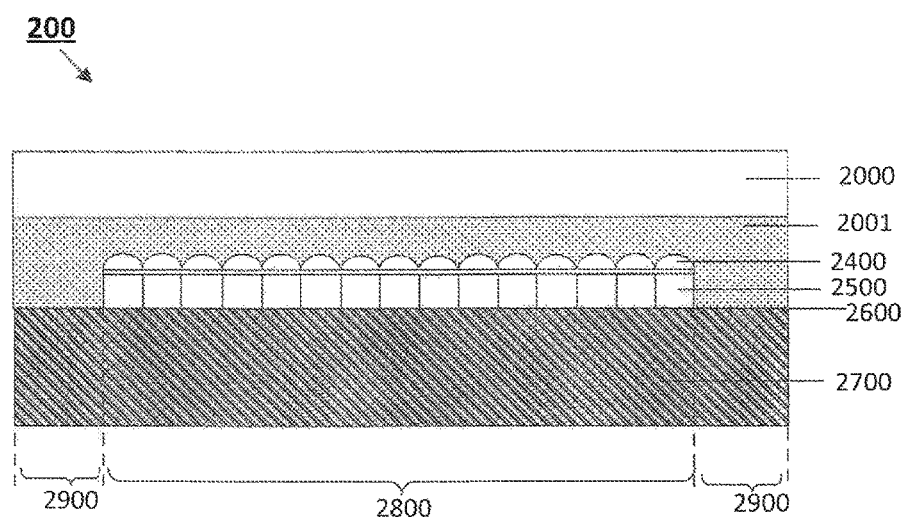
FIG. 2 is a cross sectional illustration of an improved chip CSP structure for an image sensor, in accordance with the teachings of the present invention.

FIG. 2 is a cross sectional illustration of an improved chip scale package (CSP) structure 200 for an image sensor, in accordance with the teachings of the present invention. The improved chip scale package (CSP) structure 200 comprises an image sensor chip, wherein the image sensor chip comprises a semiconductor substrate 2700 having a top surface 2600 to receive light, a plurality of color filters 2500 disposed over the top surface 2600, and a plurality of micro lenses 2400 disposed on the plurality of color filters 2500. In one example, the image sensor chip comprises a light sensing array region 2800 formed on the semiconductor substrate 2700. The image sensor chip may further comprise a peripheral circuit region 2900 formed on the semiconductor substrate 2700 and around the light sensing array region 2800. When the image sensor continues scaled down, especially for stacking chip image sensor, there will be less and less peripheral circuit region 2900.

In one example, a low refractive index material 2001 is disposed over the image sensor chip. The low refractive index material 2001 covers the plurality of micro lenses 2400, wherein a refractive index of the low refractive index material 2001 is lower than a refractive index of the plurality of micro lenses 2400. In one example, the low refractive index material 2001 further covers the peripheral circuit region 2900. A cover glass 2000 is disposed directly on the low refractive index material 2001, wherein there is no air gap between the cover glass 2000 and the low refractive index material 2001, and between the low refractive index material 2001 and the image sensor chip. Therefore, the cover glass 2000 is fully supported by the low refractive index material 2001 without any dams between the cover glass 2000 and the image sensor chip. When the image sensor continues scaled down, especially for stacking chip image sensor, there is less and less periphery area for dams to land on. This new improved CSP structure 200 could avoid the limitation of the dam width due to the smaller periphery area and consequently eliminate the dam related CSP reliability issues and petal flare artificial pattern which are observed on the conventional CSP structure 100. Moreover, because the refractive index of the low refractive index material 2001 is lower than the refractive index of the micro lenses 2400, the overall quantum efficiency (QE) of the image sensor is not negatively impacted.

In one example, the low refractive index material 2001 comprises at least one of organic materials such as carbon based organic materials. In another example, the low refractive index material 2001 comprises at least one of inorganic materials such as SiO2. No matter what kind of materials are chosen to form the low refractive index material 2001, the low refractive index material 2001 comprises at least one of insulation materials and has a refractive index lower than a refractive index of micro lenses 2400. As an example, the low refractive index material 2001 may be one kind of carbon based organic materials with a refractive index between 1.2~1.3, and the micro lenses 2400 has a refractive index ~1.5, and a refractive index of the cover glass 2000 is ~1.46. Due to the difference of the refractive index between the low refractive index material 2001, the micro lenses 2400 and the cover glass 2000, the depth of focus of micro lenses 2400 may become deeper compared to the conversional CSP structure 100, but QE of the image sensor may not be impacted at all.

Figure 3A:
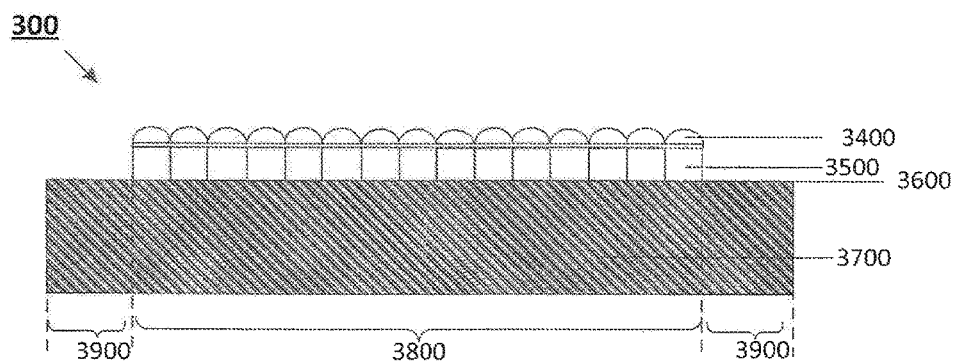
FIGS. 3A-3C are cross sectional illustrations of an example process flow to fabricate the example CSP structure for an image sensor which is demonstrated in FIG. 2, in accordance with the teachings of the present invention.
Figure 3B:
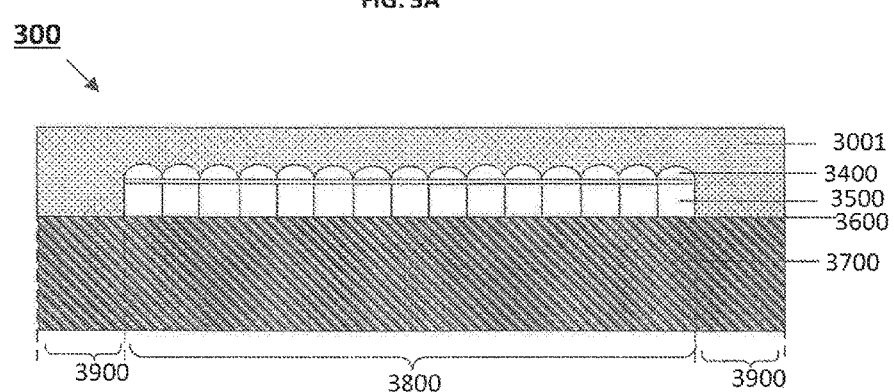
Figure 3C:
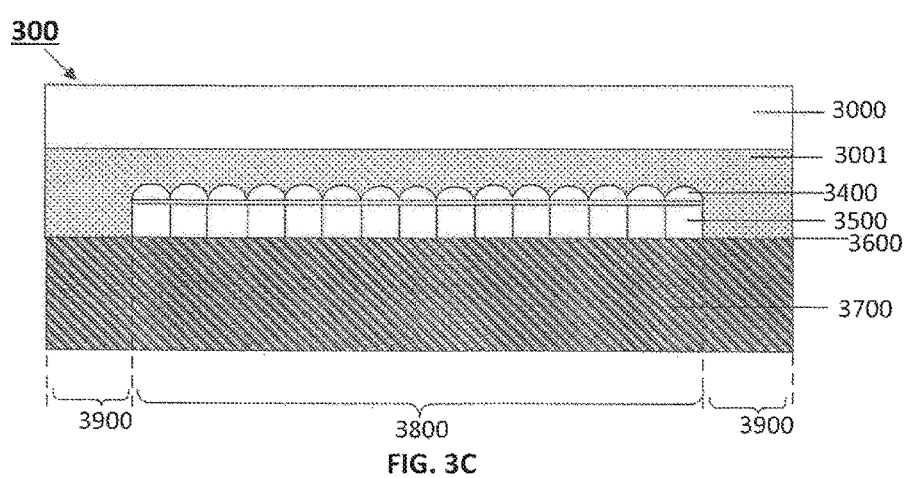

FIGS. 3A-3C illustrates an example method 300 for fabrication of an example improved CSP structure 200 for an image sensor chip which is demonstrated in FIG. 2, in accordance with the teachings of the present invention. The order in which some or all of FIGS. 3A-3C appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain process steps and figures in order to avoid obscuring certain aspects. Alternatively, method 300 may include additional process steps and figures that may not be necessary in some embodiments/examples of the disclosure.

In FIG. 3A, an image sensor chip is provided first, wherein the image sensor chip comprises a semiconductor substrate 3700 having a top surface 3600 to receive light, a plurality of color filters 3500 disposed on the top surface 3600 and a plurality of micro lenses 3400 disposed on the plurality of color filters 3500. In one example, the image sensor chip comprises a light sensing array region 3800 formed on the semiconductor substrate 3700. The image sensor chip may further comprise a peripheral circuit region 3900 formed on the semiconductor substrate 3700 and around the light sensing array region 3800. In FIG. 3B, a low refractive index material 3001 is disposed over the image sensor chip, wherein the low refractive index material 3001 covers the plurality of micro lenses 3400, and wherein a refractive index of the low refractive index material 3001 is lower than a refractive index of the plurality of micro lenses 3400. In one example, the low refractive index material 3001 further covers the peripheral circuit region 3900. The low refractive index material 3001 comprises at least one of insulation materials, wherein the low refractive index material 3001 comprises at least one of organic materials, wherein the low refractive index material 3001 may also comprise at least one of inorganic materials. The low refractive index material 3001 may be deposited by any material deposition process method such as chemical vapor deposition (CVD), physical vapor deposition (PVD), or spin on process. After the deposition, the surface of the low refractive index material 3001 is flattened in order to get ready to dispose a cover glass 3000. In FIG. 3C, the cover glass 3000 is disposed directly on the low refractive index material 3001, wherein no air gap is between the cover glass 3000 and the low refractive index material 3001, and between the low refractive index material 3001 and the image sensor chip. Therefore, the cover glass 3000 is fully supported by the low refractive index material 3001 without any dams between the cover glass 3000 and the image sensor chip.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A chip scale package (CSP) structure for an image sensor, comprising:
   an image sensor chip, wherein the image sensor chip comprises:
   a semiconductor substrate having a top surface to receive light;
   a plurality of color filters disposed over the top surface; and
   a plurality of micro lenses disposed on the plurality of color filters;
   a low refractive index material disposed over the image sensor chip, wherein the low refractive index material covers the plurality of micro lenses, and wherein a refractive index of the low refractive index material is lower than a refractive index of the plurality of micro lenses; and
   a cover glass disposed directly on the low refractive index material, wherein no air gap is between the cover glass and the low refractive index material, and between the low refractive index material and the image sensor chip;
   wherein the low refractive index material comprises at least one of inorganic materials.

2. The image sensor package of claim 1, wherein the image sensor chip further comprises a plurality of light sensing elements formed on the semiconductor substrate.

3. The image sensor package of claim 2, wherein the image sensor chip further comprises a peripheral circuit region formed on the semiconductor substrate and around the plurality of light sensing elements.

4. The image sensor of claim 3, wherein the low refractive material further covers the peripheral circuit region.

5. The image sensor package of claim 1, wherein the cover glass is fully supported by the low refractive index material without any dams between the cover glass and the image sensor chip.

6. The image sensor package of claim 1, wherein the low refractive index material comprises at least one of insulation materials.

7. The image sensor package of claim 6, wherein the refractive index of the low refractive index material is between 1.2 and 1.3.

8. A method of forming a chip scale package (CSP) structure for an image sensor, comprising:
   providing an image sensor chip, wherein the image sensor chip comprises:
   a semiconductor substrate having a top surface to receive light;
   a plurality of color filters disposed on the top surface; and
   a plurality of micro lenses disposed on the plurality of color filters;
   depositing a low refractive index material over the image sensor chip, wherein the low refractive index material covers the plurality of micro lenses, and wherein a refractive index of the low refractive index material is lower than a refractive index of the plurality of micro lenses; and
   disposing a cover glass directly on the low refractive index material, wherein no air gap is between the cover glass and the low refractive index material, and between the low refractive index material and the image sensor chip;
   wherein the low refractive index material comprises at least one of inorganic materials.

9. The method of claim 8, wherein the image sensor chip further comprises a plurality of light sensing elements formed on the semiconductor substrate.

10. The method of claim 8, wherein the image sensor chip further comprises a peripheral circuit region formed on the semiconductor substrate and around the plurality of light sensing elements.

11. The method of claim 8, wherein the low refractive material further covers the peripheral circuit region.

12. The method of claim 8, wherein the cover glass is fully supported by the low refractive index material without any dams between the cover glass and the image sensor chip.

13. The method of claim 8, wherein the low refractive index material comprises at least one of insulation materials.

14. The method of claim 13, wherein the refractive index of the low refractive index material is between 1.2 and 1.3.

* * * * *